(12) United States Patent
Oishi et al.

(10) Patent No.: US 8,370,781 B2
(45) Date of Patent: Feb. 5, 2013

(54) COMPUTER PRODUCT FOR SUPPORTING DESIGN AND VERIFICATION OF INTEGRATED CIRCUIT

(75) Inventors: Ryosuke Oishi, Kawasaki (JP); Akio Matsuda, Kawasaki (JP)

(73) Assignee: Fujitsu Limited, Kawasaki-Shi (JP)

( * ) Notice: Subject to any disclaimer, the term of this patent is extended or adjusted under 35 U.S.C. 154(b) by 1082 days.

(21) Appl. No.: 11/896,301

(22) Filed: Aug. 30, 2007

(65) Prior Publication Data

US 2008/0120581 A1    May 22, 2008

(30) Foreign Application Priority Data

Nov. 21, 2006  (JP) .................................. 2006-314316

(51) Int. Cl.
*G06F 17/50*  (2006.01)
(52) U.S. Cl. .................... 716/111; 716/101; 716/104
(58) Field of Classification Search .................. 716/101, 716/104, 111
See application file for complete search history.

(56) References Cited

U.S. PATENT DOCUMENTS

| | | | | |
|---|---|---|---|---|
| 5,519,630 | A * | 5/1996 | Nishiyama et al. ............. | 716/17 |
| 6,718,535 | B1 * | 4/2004 | Underwood ................... | 717/101 |
| 7,137,100 | B2 * | 11/2006 | Iborra et al. .................. | 717/106 |
| 7,603,636 | B2 * | 10/2009 | Yamada ........................... | 716/4 |

FOREIGN PATENT DOCUMENTS

| | | |
|---|---|---|
| JP | 2000-112747 | 4/2000 |
| JP | 2000-353082 | 12/2000 |
| JP | 2003-76548 | 3/2003 |
| JP | 2003-108220 | 4/2003 |
| JP | 2003-178103 | 6/2003 |
| JP | 2004-70810 | 3/2004 |
| JP | 2005-530238 | 10/2005 |
| WO | 03/107180 | 12/2003 |

OTHER PUBLICATIONS

Notice of Rejection, mailed May 19, 2009, in corresponding Japanese Application No. 2006-314316 (6 pp.).

* cited by examiner

*Primary Examiner* — Thuan Do
(74) *Attorney, Agent, or Firm* — Staas & Halsey LLP

(57) ABSTRACT

Design and verification support related to integrated circuits that includes acquiring a first use case diagram representing a function of an object subject to design and verification and an activity diagram representing a processing procedure of the object; analyzing a structure of the activity diagram acquired at the acquiring step; converting the activity diagram to a second use case diagram representing a function of the object, based on the structure analyzed at the analyzing; verifying uniformity of the first use case diagram and the second use case diagram; and outputting a verification result obtained at the verifying uniformity.

6 Claims, 19 Drawing Sheets

FIG.13A

|   | USE CASE DIAGRAM 1201 | CONVERTED USE CASE DIAGRAM 1202 |
|---|---|---|
| A | ○ | ○ |
| B | ○ | ○ |
| C | ○ | ○ |
| D | ○ | × |
| E | × | ○ |

FIG.13B

|   | ACTIVITY DIAGRAM SET 1210 | ACTIVITY DIAGRAM SET 1220 |
|---|---|---|
| A | ○ | ○ |
| B | ○ | ○ |
| C | ○ | ○ |
| D | ○ | × |
| E | × | ○ |

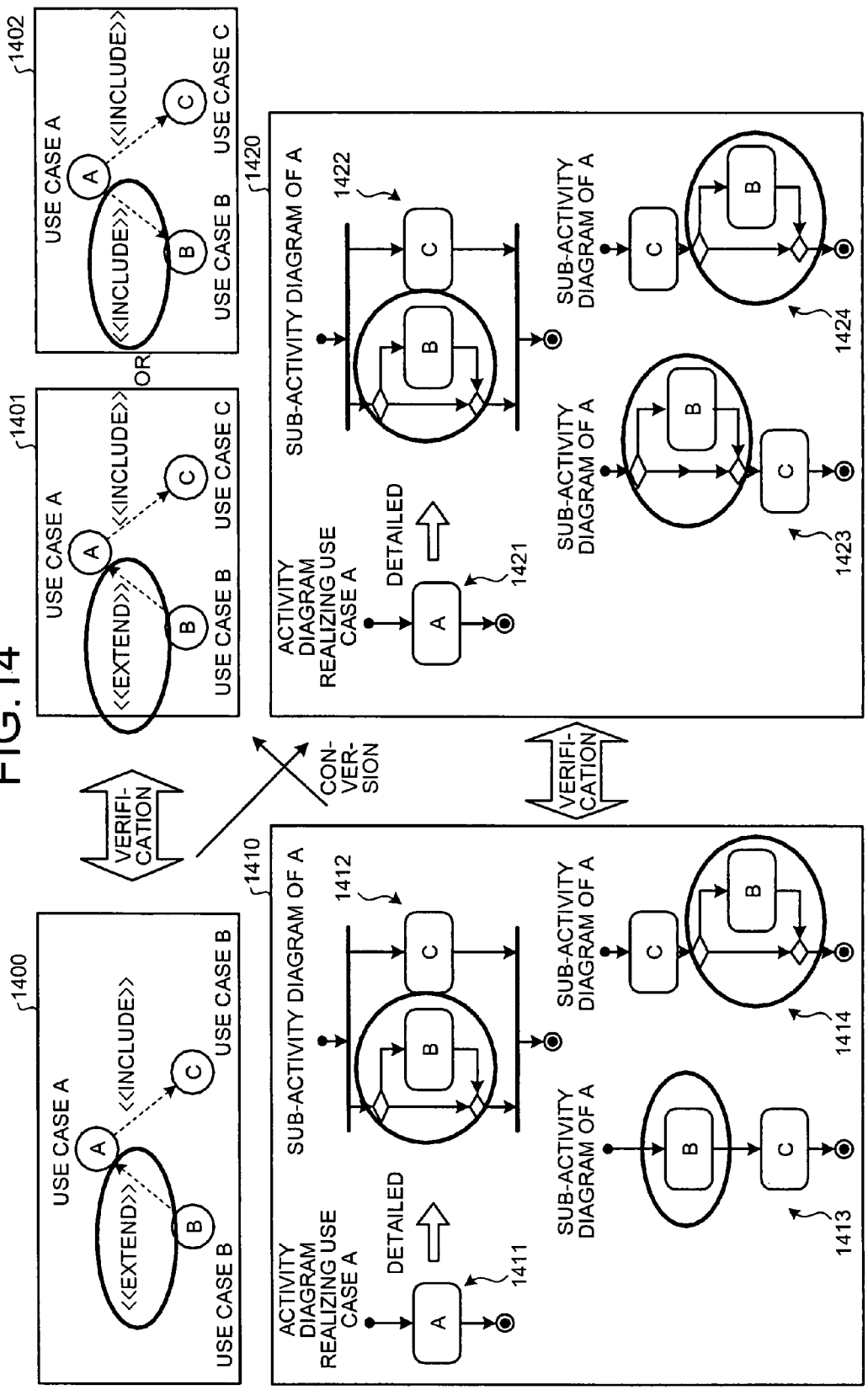

FIG.15A

|  | USE CASE DIAGRAM 1400 | USE CASE DIAGRAM 1401 | USE CASE DIAGRAM 1402 |
|---|---|---|---|
| A-B | ○ | ○ | × |
| A-C | ○ | ○ | ○ |
| B-C | - | - | - |

FIG.15B

|  | ACTIVITY DIAGRAM 1411 | ACTIVITY DIAGRAM 1421 |
|---|---|---|
| A | ○ ||

FIG.15C

| | SUB-ACTIVITY DIAGRAM 1412 | SUB-ACTIVITY DIAGRAM 1422 | SUB-ACTIVITY DIAGRAM 1413 | SUB-ACTIVITY DIAGRAM 1423 | SUB-ACTIVITY DIAGRAM 1414 | SUB-ACTIVITY DIAGRAM 1424 |
|---|---|---|---|---|---|---|
| B | ○ | | × | | ○ | |
| C | ○ | | ○ | | ○ | |

COMPUTER PRODUCT FOR SUPPORTING DESIGN AND VERIFICATION OF INTEGRATED CIRCUIT

CROSS-REFERENCE TO RELATED APPLICATIONS

This application is based upon and claims the benefit of priority from the prior Japanese Patent Application No. 2006-314316, filed on Nov. 21, 2006, the entire contents of which are incorporated herein by reference.

BACKGROUND OF THE INVENTION

1. Field of the Invention

The present invention relates to design and verification of a large-scale integration (LSI).

2. Description of the Related Art

Expression or description of a specification or a computer-interpretable specification model using unified modeling language (UML) is becoming essential in upstream design processes of LSI design and in upstream processes of software development as a whole. The specification is described by a use case diagram and the specification model is described by an activity diagram (and vice versa), and with respect to these diagrams, means of expressing each of them are provided such as that described in Japanese Patent Application Laid-Open Publication Nos. 2003-76548, 2003-108220, 2003-178103, 2004-70810, and 2000-353082; and PCT International Patent Application Japanese Translation Publication No. 2005-530238.

However, in the above conventional technologies, as the use case diagram and the activity diagram are prepared independently of each other with respect to same object subject to design and verification, a problem of inconsistency between the use case diagram and the activity diagram arises.

The inconsistency between the use case diagram and the activity diagram leads to errant upstream design, resulting in design errors or redesign. Therefore, in the above conventional technologies, problems related to increased labor and lengthened design periods arise.

SUMMARY OF THE INVENTION

It is an object of the present invention to at least solve the above problems in the conventional technologies.

A computer-readable recording medium according to one aspect of the present invention stores therein a design and verification support program causing a computer to execute acquiring a use case diagram representing a function of an object subject to design and verification; analyzing a structure of the use case diagram; converting the use case diagram to an activity diagram representing a processing procedure of the object, based on the structure analyzed at the analyzing; and outputting the activity diagram converted at the converting.

A computer-readable recording medium according to another aspect of the present invention stores therein a design and verification support program causing a computer to execute acquiring an activity diagram representing a processing procedure of an object subject to design and verification; analyzing a structure of the activity diagram; converting the activity diagram to a use case diagram representing a function of the object, based on the structure analyzed at the analyzing; and outputting the use case diagram converted at the converting.

A computer-readable recording medium according to yet another aspect of the present invention stores therein a design and verification support program causing a computer to execute acquiring a use case diagram representing a function of an object subject to design and verification and a first activity diagram representing a processing procedure of the object analyzing a structure of the use case diagram; converting the use case diagram to a second activity diagram representing a processing procedure of the object, based on the structure analyzed at the analyzing; verifying uniformity of the first activity diagram and the second activity diagram; and outputting a verification result obtained at the verifying uniformity.

A computer-readable recording medium according to still another aspect of the present invention stores therein a design and verification support program causing a computer to execute acquiring a first use case diagram representing a function of an object subject to design and verification and an activity diagram representing a processing procedure of the object; analyzing a structure of the activity diagram acquired at the acquiring step; converting the activity diagram to a second use case diagram representing a function of the object, based on the structure analyzed at the analyzing; verifying uniformity of the first use case diagram and the second use case diagram; and outputting a verification result obtained at the verifying uniformity.

A design and verification support apparatus according to yet another aspect of the present invention includes an acquiring unit that acquires a use case diagram representing a function of an object subject to design and verification; an analyzing unit that analyzes a structure of the use case diagram; a converting unit that converts the use case diagram to an activity diagram representing a processing procedure of the object, based on the structure analyzed by the analyzing unit; and an outputting unit that outputs the activity diagram converted by the converting unit.

A design and verification support apparatus according to still another aspect of the present invention includes an acquiring unit that acquires an activity diagram representing a processing procedure of an object subject to design and verification; an analyzing unit that analyzes a structure of the activity diagram; a converting unit that converts the activity diagram to a use case diagram representing a function of the object, based on the structure analyzed by the analyzing unit; and an outputting unit that outputs the use case diagram converted by the converting unit.

A design and verification support apparatus according to still another aspect of the present invention includes an acquiring unit that acquires a use case diagram representing a function of an object subject to design and verification and a first activity diagram representing a processing procedure of the object; an analyzing unit that analyzes a structure of the use case diagram; a converting unit that converts the use case diagram to a second activity diagram representing a processing procedure of the object, based on the structure analyzed by the analyzing unit; a verifying unit that verifies uniformity of the first activity diagram and the second activity diagram; and an outputting unit that outputs a verification result obtained by the verifying unit.

A design and verification support apparatus according to still another aspect of the present invention includes an acquiring unit that acquires a first use case diagram representing a function of an object subject to design and verification and an activity diagram representing a processing procedure of the object; an analyzing unit that analyzes a structure of the activity diagram acquired by the acquiring unit; a converting unit that converts the activity diagram to a second use case diagram representing a function of the object, based on the structure analyzed by the analyzing unit; a verifying unit that verifies uniformity of the first use case diagram and the second use case diagram; and an outputting unit that outputs a verification result obtained by the verifying unit.

A design and verification support method according to yet another aspect of the present invention includes acquiring a use case diagram representing a function of an object subject to design and verification; analyzing a structure of the use case diagram; converting the use case diagram to an activity diagram representing a processing procedure of the object, based on the structure analyzed at the analyzing; and outputting the activity diagram converted at the converting.

A design and verification support method according to still another aspect of the present invention includes acquiring an activity diagram representing a processing procedure of an object subject to design and verification; analyzing a structure of the activity diagram; converting the activity diagram to a use case diagram representing a function of the object, based on the structure analyzed at the analyzing; and outputting the use case diagram converted at the converting.

A design and verification support method according to yet another aspect of the present invention includes acquiring a use case diagram representing a function of an object subject to design and verification and a first activity diagram representing a processing procedure of the object; analyzing a structure of the use case diagram; converting the use case diagram to a second activity diagram representing a processing procedure of the object, based on the structure analyzed at the analyzing; verifying uniformity of the first activity diagram and the second activity diagram; and outputting a verification result obtained at the verifying uniformity.

A design and verification support method according to still another aspect of the present invention includes acquiring a first use case diagram representing a function of an object subject to design and verification and an activity diagram representing a processing procedure of the object; analyzing a structure of the activity diagram acquired at the acquiring step; converting the activity diagram to a second use case diagram representing a function of the object, based on the structure analyzed at the analyzing; verifying uniformity of the first use case diagram and the second use case diagram; and outputting a verification result obtained at the verifying uniformity.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 13A is a table of verification results for use case diagrams shown in FIG. 12;

FIG. 13B is a table of verification results for activity diagrams shown in FIG. 12;

FIG. 14 is another explanatory diagram of content of verification processing;

FIG. 15A is a table of verification results for use case diagrams shown in FIG. 14;

FIG. 15B is a table of verification results for upper-class activity diagrams shown in FIG. 14;

FIG. 15C is a table of verification results for sub-activity diagrams shown in FIG. 14;

DETAILED DESCRIPTION OF THE PREFERRED EMBODIMENTS

Referring to the accompanying drawings, exemplary embodiments according to the present invention are explained in detail below.

Figure 1:
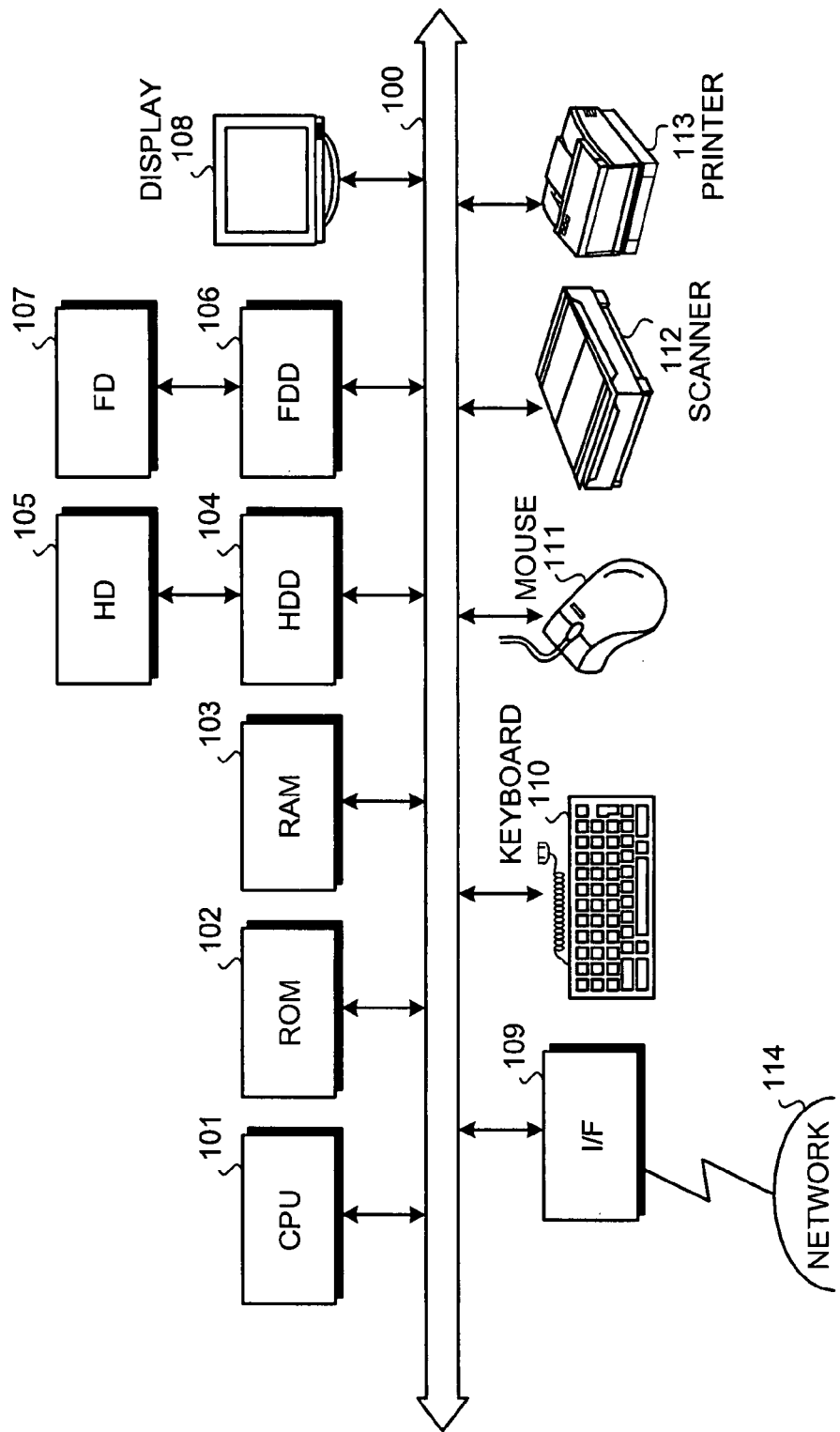
FIG. 1 is a schematic of a design and verification support apparatus according to an embodiment of the present invention.

FIG. 1 is a schematic of a design and verification support apparatus according to the embodiments of the present invention. As shown in FIG. 1, the design and verification support apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removal recording medium, a display 108, an interface (I/F) 109, a keyboard 110, a mouse 111, a scanner 112, and a printer 113. These component units are connected to one another by way of a bus 100.

The CPU 101 is in charge of overall control of the design and verification support apparatus. The ROM 102 stores programs such as a boot program. The RAM 103 is used as a work area of the CPU 101. The HDD 104 controls the reading and writing of data to and from the HD 105 under the control of the CPU 101. The HD 105 stores the data written under the control of the HDD 104.

The FDD 106 controls the reading and writing of data to and from the FD 107 under the control of the CPU 101. The FD 107 stores the data written under the control of the FDD 106 and data stored in the FD 107 is read by the design and verification support apparatus.

A removal recording medium, besides the FD 107, may be a compact disk read-only memory (CD-ROM) including compact disk-record (CD-R) and compact disk-rewritable (CD-RW), a magneto optical disk (MO), a digital versatile disk (DVD), or a memory card. The display 108 displays a cursor, an icon, a tool box, and data such as document, image, and function information. The display 108 may be, for example, a CRT, a thin film transistor liquid crystal display (TFT-LCD), or a plasma display.

The I/F 109 is connected to a network 114 such as the Internet through a telecommunication line and is connected to other devices by way of the network 114. The I/F 109 serves as an interface between the network 114 and the inside of the apparatus, and controls the input and output of data to and from external devices. The I/F 109 may be, for example, a modem or a local area network adapter.

The keyboard 110 is equipped with keys for the input of characters, numerals, and various instructions. Data is entered through the keyboard 110. The keyboard 110 may be a touch-panel input pad or a numeric keypad. The mouse 111 enables cursor movement, range selection, movement of a window, size change of a window, etc. The mouse 111 may be a trackball or a joystick if it has similar functions as a pointing device.

The scanner 112 optically reads an image and loads the image data into the design and verification support apparatus. The scanner 112 may have an optical character recognition (OCR) function as well. The printer 113 prints image data and document data. The printer 113 may be, for example, a laser printer or an ink jet printer.

Figure 2:
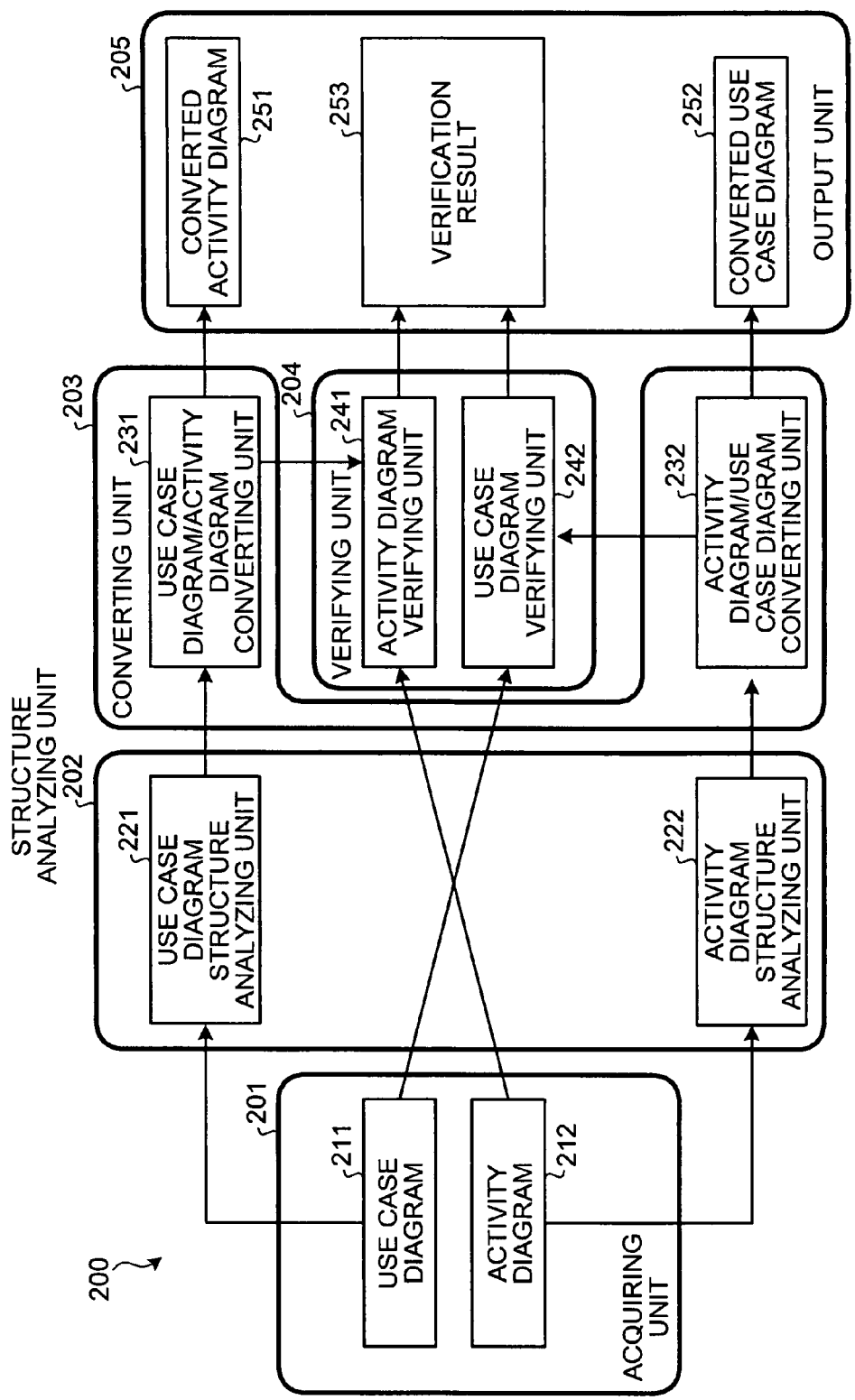
FIG. 2 is a block diagram illustrating functional configuration of the design and verification support apparatus according to an embodiment of the present invention.

Description will be made of a functional configuration of the design and verification support apparatus according to an embodiment of the present invention. FIG. 2 is a block diagram of the functional configuration of the design and verification support apparatus according to an embodiment of the present invention. In FIG. 2, the design and verification support apparatus 200 comprises an acquiring unit 201, a structure analyzing unit 202, a converting unit 203, a verifying unit 204, and output unit 205. Specifically, these functional components realize their functions, for example, through the execution by the CPU 101 of a program recorded on a recording medium such as the ROM 102, the RAM 103, the HD 105, and the FD 107, or by the I/F 109.

The acquiring unit 201 acquires a use case diagram 211 and an activity diagram 212 regarding the same object subject to design and verification. The object to be designed and verified is, for example, a system to be designed or verified in an upstream design, irrespective of whether it is hardware or software.

The use case diagram 211 is graphic data representing a function of the object subject to design and verification and is data whose description contents can be interpreted by a computer, e.g., CPU 101. The activity diagram 212 is graphic data representing a processing procedure of the object subject to design and verification and is data whose description contents can also be interpreted by a computer, e.g., CPU 101.

The data making up the use case diagram 211 and the activity diagram 212 is referred to as "element". In particular, the data making up the use case diagram 211 is referred to as "use case element" and the data making up the activity diagram 212 is referred to as "activity element". Namely, the use case diagram 211 is composed of a group of use case elements and the activity diagram 212 is composed of a group of activity elements.

The use case element includes, for example, a use case, an actor, a connecting line connecting the use case and the actor, a connecting line (including stereotype) representing a relationship between the use cases (include relationship, extend relationship, or generalization relationship), etc. The activity element includes an activity, a sub-activity, a starting point, a terminating point, a transition (arrow to activity, etc.), a guard condition, a branch, a sync bar (fork, join), a swim lane, a signal, etc.

The acquiring unit 201 may be configured to read a use case diagram and an activity diagram prepared through the input of the elements using an input device such as the keyboard 110 and the mouse 111, or extract a use case diagram and a activity diagram pre-stored in the data base, or receive (download) a use case diagram and an activity diagram from an external computer device by way of the network 114.

The use case diagram 211 acquired may be a use case diagram representing functions of the object subject to design and verification as a whole or may be a use case diagram representing functions of a part of the object subject to design and verification if at least a use case is included therein. The use case diagram 211 is hereinafter referred to as "subject use case diagram 211".

Likewise, the activity diagram 212 acquired may be an activity diagram representing a processing procedure of the object subject to design and verification as a whole or may be an activity diagram 212 representing a processing procedure of a part of the object subject to design and verification if at least an activity or sub-activity is included therein. The activity diagram 212 is hereinafter referred to as "subject activity diagram 212".

The structure analyzing unit 202 comprises a use case diagram structure analyzing unit 221 and an activity diagram structure analyzing unit 222. The use case diagram structure analyzing unit 221 analyzes the structure of the subject use case diagram 211. Specifically, the use case diagram structure analyzing unit 221 analyzes what kinds of use case elements compose the subject use case diagram 211, relationships between the use case elements, and the type of relationship (include relationship, extend relationship, or generalization relationship).

The activity diagram structure analyzing unit 222 analyzes the structure of the subject activity diagram 212. Specifically, the activity diagram structure analyzing unit 221 analyzes what kinds of activity elements compose the subject activity diagram 212, relationships between the activity elements, what kinds of processing procedures these activity elements represent, and what kinds of conditions are imposed on the activity elements.

The converting unit 203 includes a use case diagram-activity diagram converting unit 231 and an activity diagram-use case diagram converting unit 232. The use case diagram-activity diagram converting unit 231 converts the subject use case diagram 211 structure-analyzed by the use case diagram structure analyzing unit 221 to an activity diagram.

While detailed examples of conversion will be described hereinafter, a converting technique, in short, is a technique of converting, for example, the subject use case diagram 211 to an activity diagram X taking a use case x within the subject use case diagram 211 as an activity x. For example, if the use case x is a use case of "prepare a quotation", then the activity diagram X will be an activity diagram illustrating the process of the activity x of "prepare a quotation".

When use cases x and y have an include relationship, the including use case x is converted to the activity x in the activity X diagram and the included use case y is converted to a sub-activity diagram of the activity diagram X as a sub-activity of activity x.

For example, if the use case y is a use case "confirm user information", then the activity diagram X will be an activity diagram illustrating the process of the activity x "prepare a quotation" and the activity diagram Y will be an activity diagram illustrating the process of the sub-activity y "confirm user information".

When use cases x and z have an extend relationship, the base use case x is converted to the activity x in the activity diagram X and the extending use case z is converted to a sub-activity diagram Z as a sub-activity of a branch destination of the activity x.

For example, if the use case z is a use case "make a discount", then the activity diagram X will be an activity diagram illustrating the process of the activity x "prepare a quotation" and the activity diagram Z will be an activity diagram of the use case z "make a discount" as a sub-activity of a branch destination of the activity x "prepare a quotation".

When use cases w1 and w2 have a generalization relationship, the abstract use case w1 and the concrete use case w2 are converted to activity diagrams W1 and W2 as activities w1 and w2, respectively. In this case, if the abstract activity diagram W1 has a sub-activity diagram W3, then a sub-activity diagram of the concrete activity diagram W2 also becomes the sub-activity diagram W3. The activity diagram obtained by the conversion is referred to as "converted activity diagram 251". The sub-activity diagram obtained by conversion is also referred to as "converted activity diagram 251", for the sake of convenience.

The activity diagram-use case diagram converting unit 232 converts the subject activity diagram 212 structure-analyzed by the activity diagram structure analyzing unit 222 to a use case diagram.

While detailed examples of conversion will be described hereinafter, a converting technique, in short, is a technique of converting, for example, an activity x within the subject activity diagram 212 to a use case diagram X of a use case x. For example, if the activity x is an activity "prepare a quotation", then the use case diagram X will be a use case diagram representing a function of the use case x "prepare a quotation".

When, the activity x has a sub-activity y, the activity x is converted to a use case diagram XY as an including use case x and the sub-activity y as an included use case y where use cases x and y have an include relationship.

For example, if the sub-activity y is an activity "confirm user information", then the use case diagram XY will be a use case diagram taking the activity x "prepare a quotation" as the including use case x and the sub-activity y "confirm user information" as the included use case y where the including use case x and the included use case y are connected corresponding to the include relationship.

When the activity x has a sub-activity z as a branch destination, the activity x is converted to a use case diagram XZ as a base use case x and the sub-activity z as an extending use case z where use cases x and z have an extend relationship.

For example, if the sub-activity z is an activity "make a discount", then the use case diagram XZ will be a use case diagram taking the activity x "prepare a quotation" as the base use case x and the sub-activity z "making a discount" as the extending use case z where the base use case x and the extending use case z are connected by the extend relationship. The use case diagram obtained by conversion is referred to as "converted use case diagram 252".

The verifying unit 204 includes an activity diagram verifying unit 241 and a use case diagram verifying unit 242. The activity diagram verifying unit 241 verifies uniformity of the subject activity diagram 212 and the converted activity diagram 251 (or the converted sub-activity diagram). This verification is to confirm, for example, whether the subject activity diagram 212 matches the converted activity diagram 251 and whether the subject activity diagram 212 matches the converted sub-activity diagram. When there are multiple converted sub-activity diagrams, the activity diagram verifying unit 241 verifies whether the subject activity diagram 212 is included in the converted sub-activity diagrams.

The use case diagram verifying unit 242 verifies uniformity of the subject use case diagram 211 and the converted use case diagram 252. This verification is to confirm, for example, whether use cases match between the subject use case diagram 211 and the converted use case diagram 252 and whether the relationships between the use cases in the subject use case diagram 211 and the relationships between the use cases in the converted use case diagram 252 match.

The output unit 205 outputs the converted use case diagram 252, the converted activity diagram 251 (including the converted sub-activity diagram), and a verification result 253 from the verifying unit 204. Specifically, the output unit 205 displays these kinds of output information on the display screen of the display 108 or prints out the information by the printer 113. Configuration may be such that the output information is output to and recorded on a recording medium such as the HD 105.

Figure 3:
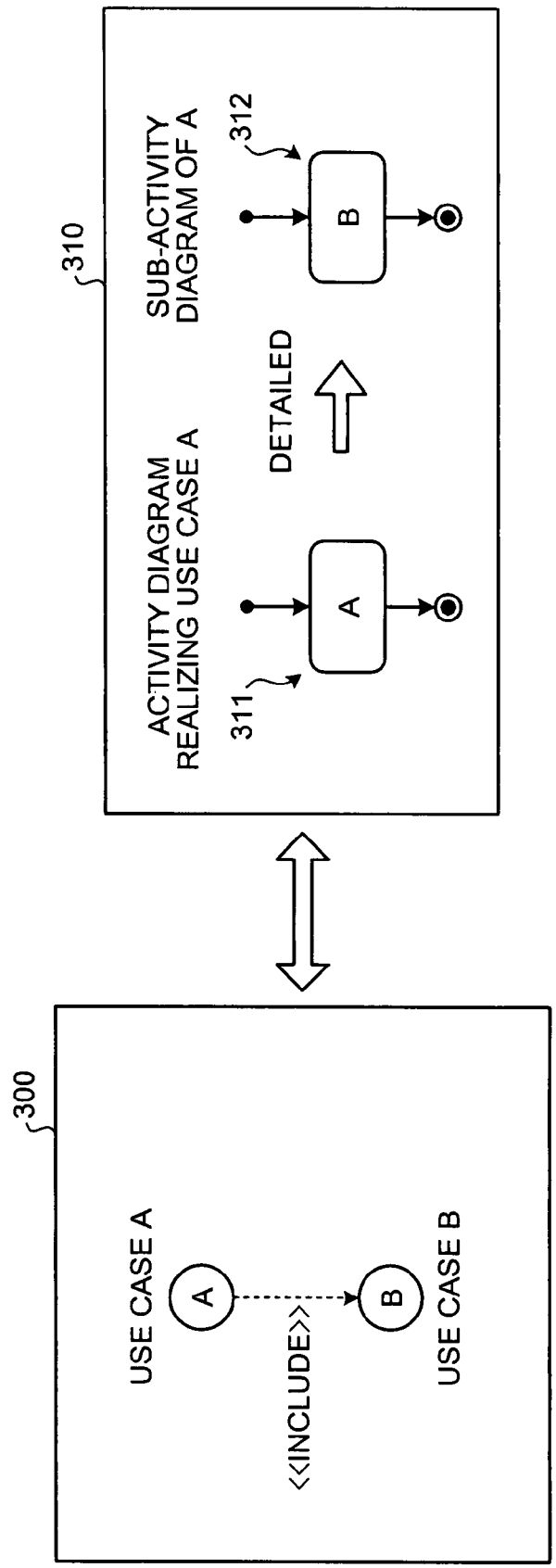
FIG. 3 is an explanatory diagram of conversion rules <R1> and <R2>.
Figure 4:
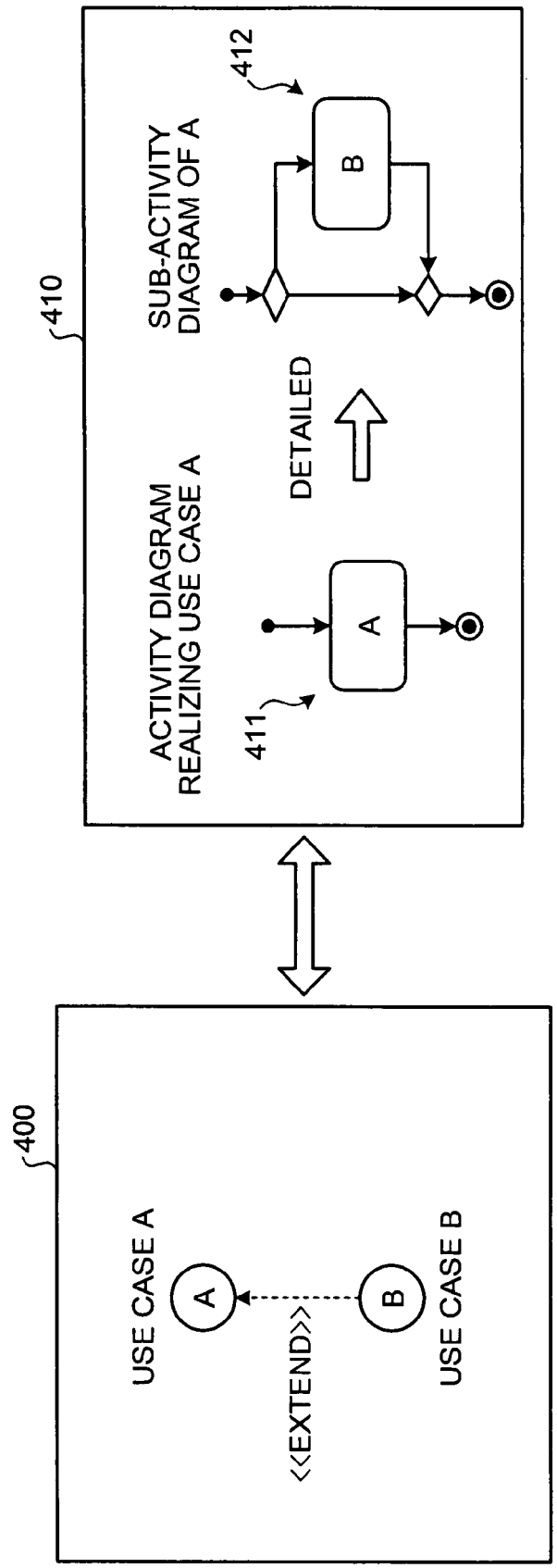
FIG. 4 is an explanatory diagram of conversion rules <R3> and <R4>.

Description will be made of rules for conversion between the use case diagram 211 and the activity diagram 212. FIG. 3 is an explanatory diagram of conversion rules <R1> and <R2> and FIG. 4 is an explanatory diagram of conversion rules <R3> and <R4>.

<R1> (Refer to FIG. 3)

When the subject use case diagram 211 is a use case diagram 300 containing use cases A and B having an include relationship and if the use case A is an including use case and the use case B is an included use case, then the use case A is converted to an activity diagram 311 illustrating the process of an activity A and the use case B is converted to a sub-activity diagram 312 illustrating the process of a sub-activity B of the activity A.

<R2> (Refer to FIG. 3)

When the subject activity diagram 212 is an activity diagram set 310 containing an activity diagram 311 illustrating the process of an activity A and a sub-activity diagram 312 illustrating the process of a sub-activity B of the activity A, the activity diagram set 310 is converted to the use case diagram 300 taking the activity A as an including use case A and the sub-activity B as an included use case B.

<R3> (Refer to FIG. 4)

When the subject use case diagram 211 is a use case diagram 400 containing use cases A and B having an extend relationship and if the use case A is a base use case and the use case B is an extending use case, the use case A is converted to an activity diagram 411 illustrating the process of an activity A and the extending case B is converted to a sub-activity diagram 412 illustrating the process of a potential sub-activity B of the activity A by branching.

<R4> (Refer to FIG. 4)

When the subject activity diagram 212 is an activity diagram set 410 containing an activity diagram 411 illustrating the process of an activity A and a sub-activity diagram 412 illustrating the process of a potential sub-activity B of the activity A by branching, the activity diagram set 410 is converted to a use case diagram 400 taking the activity A as a base use case A and the sub-activity B as an extending use case B.

Figure 5:
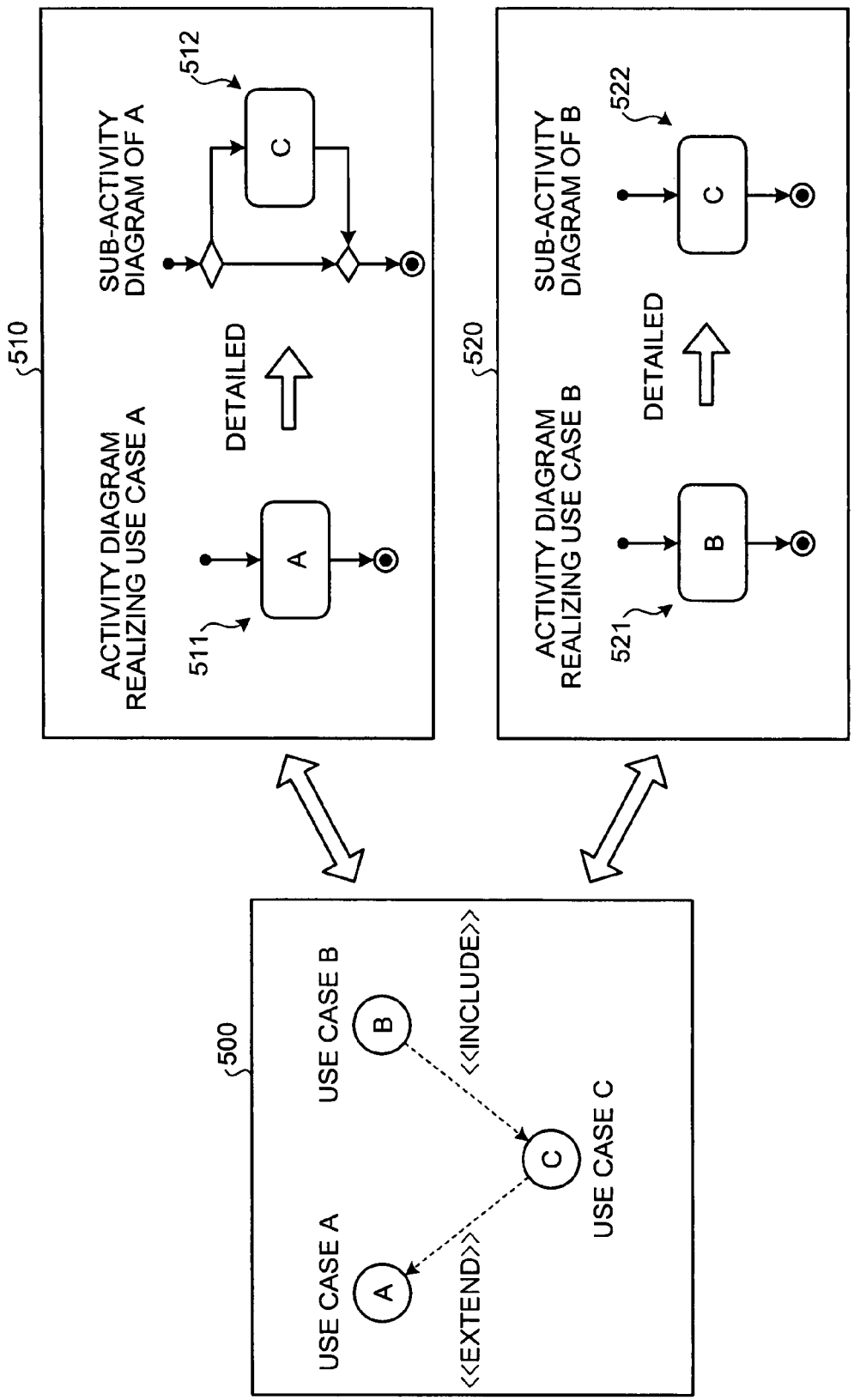
FIG. 5 is an explanatory diagram of a first conversion example of conversion between a use case diagram and an activity diagram.

Description will next be made of conversion examples using the conversion rules <R1> to <R4>. FIG. 5 is an explanatory diagram of a first conversion example of the conversion between the use case diagram and the activity diagram. The first conversion example is an example in which use cases A and C have an extend relationship and use cases B and C have an include relationship. Specifically, in a use case diagram 500, the use case C is an extending use case the use case A and at the same time, is an included use case of the use case B.

In FIG. 5, if the use case diagram 500 is considered to be the subject use case diagram 211, then the conversion rule <R3> applies to the relationship between the use cases A and C. This generates an activity diagram set 510 containing an activity diagram 511 illustrating the process of the use case A as an activity A and a sub-activity diagram 522 illustrating the process of a potential sub-activity C by branching at the activity A.

Likewise, the conversion rule <R1> applied to the relationship between the use cases B and C generates an activity diagram set 520 containing an activity diagram 521 illustrating the process of the use case B as an activity B and a sub-activity diagram 522 illustrating the process of a sub-activity C in the activity B.

If the activity diagram sets 510 and 520 are considered to be the subject activity diagram 212, then the conversion rule <R4> applies to the activity diagram set 510 and the conversion rule <R2> applies to the activity diagram set 520. In this case, in the use case diagram 500 after the conversion, the use case C converted from the sub-activities C becomes a use case common to the use cases A and B.

As seen above, in the first conversion example illustrated in FIG. 5, the fact that the sub-activities C are same activity can not be recognized from the individual activity diagram sets 510 and 520. By converting these activity diagram sets 510 and 520 to the use case diagram 500, it becomes obvious that the extending use case of the use case A and the included use case of the use case B are the same use case C.

Figure 6:
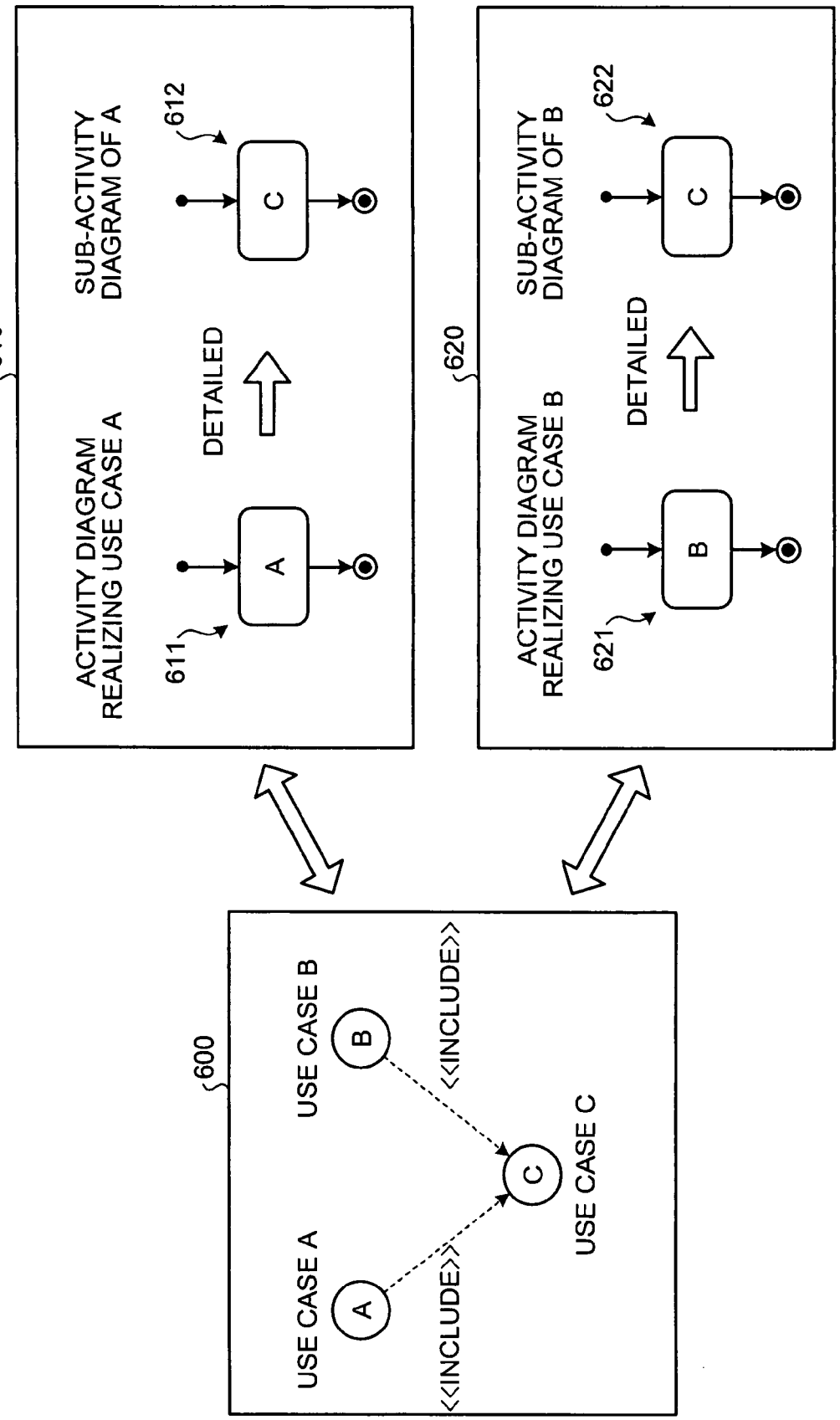
FIG. 6 is an explanatory diagram of a second example of conversion between a use case diagram and an activity diagram.

FIG. 6 is an explanatory diagram of a second conversion example of the conversion between the use case diagram and the activity diagram. The second conversion example is an example in which the use cases A and C have an include relationship and at the same time, the use cases B and C also have an include relationship. Specifically, in the use case diagram 600, both of the use cases A and B are including use cases of the use case C.

In FIG. 6, if the use case diagram 600 is considered to be the subject use case diagram 211, then the conversion rule <R1> applies to both the relationship between the use cases A and C and the relationship between the use cases B and C. Specifically, such application generates an activity diagram set 610 containing an activity diagram 611 illustrating the process of the use case A as an activity A and a sub-activity diagram 612 illustrating the process of a sub-activity C in the activity A, and also generates an activity diagram set 620 containing an activity diagram 621 illustrating the process of the use case B as an activity B and a sub-activity diagram 622 illustrating the process of a sub-activity C in the activity B.

On the other hand, if the activity diagram sets 610 and 620 are considered to be the subject activity diagram 212, then the conversion rule <R3> applies to both of the activity diagram sets 610 and 620. Specifically, such application generates the use case diagram 600 taking the upper-class activities A and B as the including use cases and the sub-activities C thereof as the included use case.

As seen above, in the second conversion example of FIG. 6, the fact that the sub-activities C are same activity can not be recognized from individual activity diagram sets 610 and 620. By converting these activity diagram sets 610 and 620 to the use case diagram 600, it becomes obvious that the included use case of the use case A and the included use case of the use case B are the same use case C.

Figure 7:
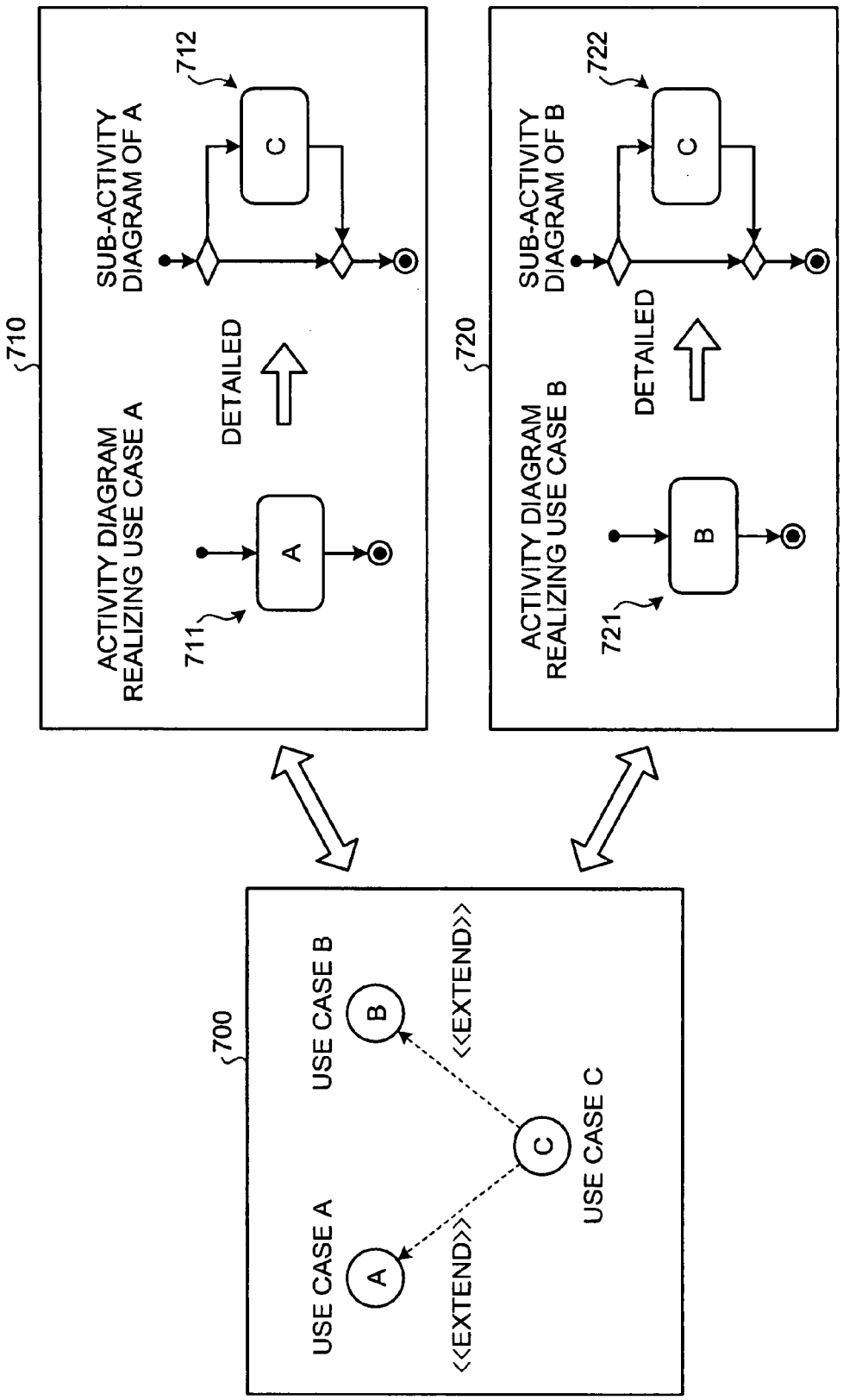
FIG. 7 is an explanatory diagram of a third example of conversion between a use case diagram and an activity diagram.

FIG. 7 is an explanatory diagram of a third conversion example of the conversion between the use case diagram and the activity diagram. The third conversion example is an example in which the use cases A and C have an extend relationship and at the same time, the use cases B and C also have an extend relationship. Specifically, in a use case diagram 700, both of the use cases A and B are base use cases of the use case C.

In FIG. 7, if the use case diagram 700 is considered to be the subject use case diagram 211, then the conversion rule <R3> applies to both the relationship between the use cases A and C and the relationship between the use cases B and C. Specifically, such application generates an activity diagram set 710 containing an activity diagram 711 illustrating the process of the use case A as an activity A and a sub-activity diagram 712 illustrating the process of a potential sub-activity C by branching in the activity A, and also generates an activity diagram set 720 containing an activity diagram 721 illustrating the process of the use case B as an activity B and a sub-activity diagram 722 illustrating the process of a potential sub-activity C by branching in the activity B.

On the other hand, if the activity diagram sets 710 and 720 are considered to be the subject activity diagram 212, then the conversion rule <R4> applies to both of the activity diagram sets 710 and 720. Specifically, such application generates the use case diagram 700 taking the upper-class activities A and B as the base use cases and the sub-activities C thereof as the extending use cases.

As seen above, in the third conversion example illustrated in FIG. 7, the fact that the sub-activities C are same activity can not be recognized from individual activity diagram sets 710 and 720. By converting these activity diagram sets 710 and 720 to the use case diagram 700, it becomes obvious that the extending use case of the use case A and the extending use case of the use case B are the same use case C.

Figure 8:
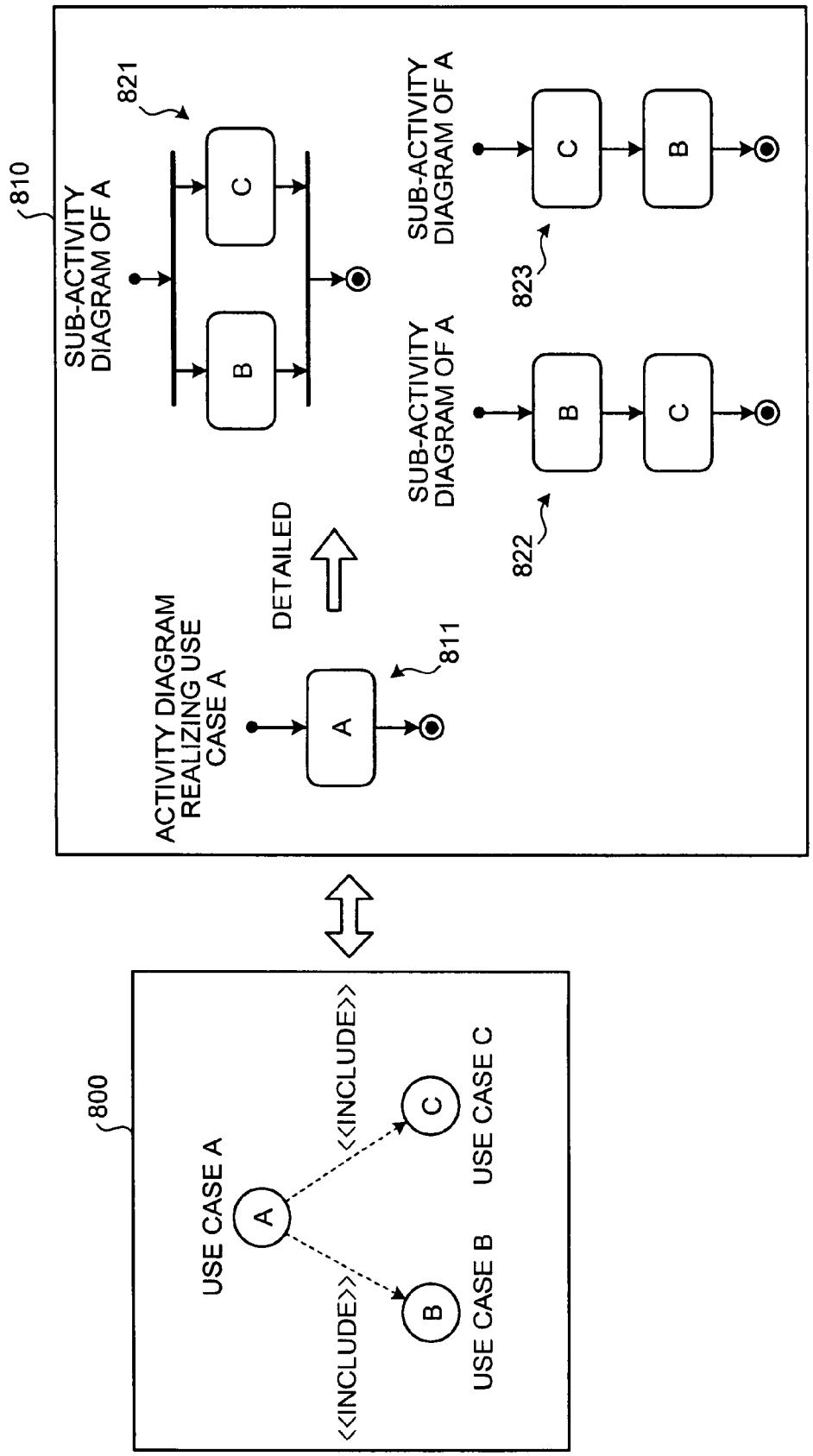
FIG. 8 is an explanatory diagram of a fourth conversion example of conversion between a use case diagram and an activity diagram.

FIG. 8 is an explanatory diagram of a fourth conversion example of the conversion between the use case diagram and the activity diagram. The fourth conversion example is an example in which the use cases A and B have an include relationship and at the same time, the use cases A and C also have an include relationship. Specifically, in a use case diagram 800, the use case A is a common including use case of the use cases B and C.

In FIG. 8, if the use case diagram 800 is considered to be the subject use case diagram 211, then the conversion rule <R1> applies to both the relationship between the use cases A and B and the relationship between the use cases A and C. Specifically, the use case diagram 800 is converted to an activity diagram 811 illustrating the process of the use case A as an activity A. Sub-activity diagrams 821 to 823 taking the use cases B and C as sub-activities B and C in the activity A are also generated. Since the use case diagram has no order relation, the sub-activity diagrams 821 to 823 covering all order relations are generated.

On the other hand, when the subject activity diagram 212 is converted to the use case diagram 800, the conversion rule <R2> applies. In this case, the activity diagram to be given as the subject activity diagram 212 may be, besides the activity diagram 811 illustrating the process of the upper-class activity A, at least any one of the sub-activity diagrams among the sub-activity diagrams 821 to 823. Therefore, even if only one of the sub-activity diagrams can be given as the subject activity diagram 212, a corresponding use case diagram can automatically be generated, and by converting the generated use case diagram, sub-activity diagrams covering all order relations can also be obtained.

While the use case diagram usually has no order relation, configuration may be such that when a pre-conversion relationship or post-conversion relationship is given to the use cases B and C, the use case diagram is converted to the sub-activity diagram satisfying the pre-conversion or post-conversion condition from among the sub-activity diagrams 821 to 823 or such sub-activity diagram is given as the subject activity diagram 212.

Figure 9:
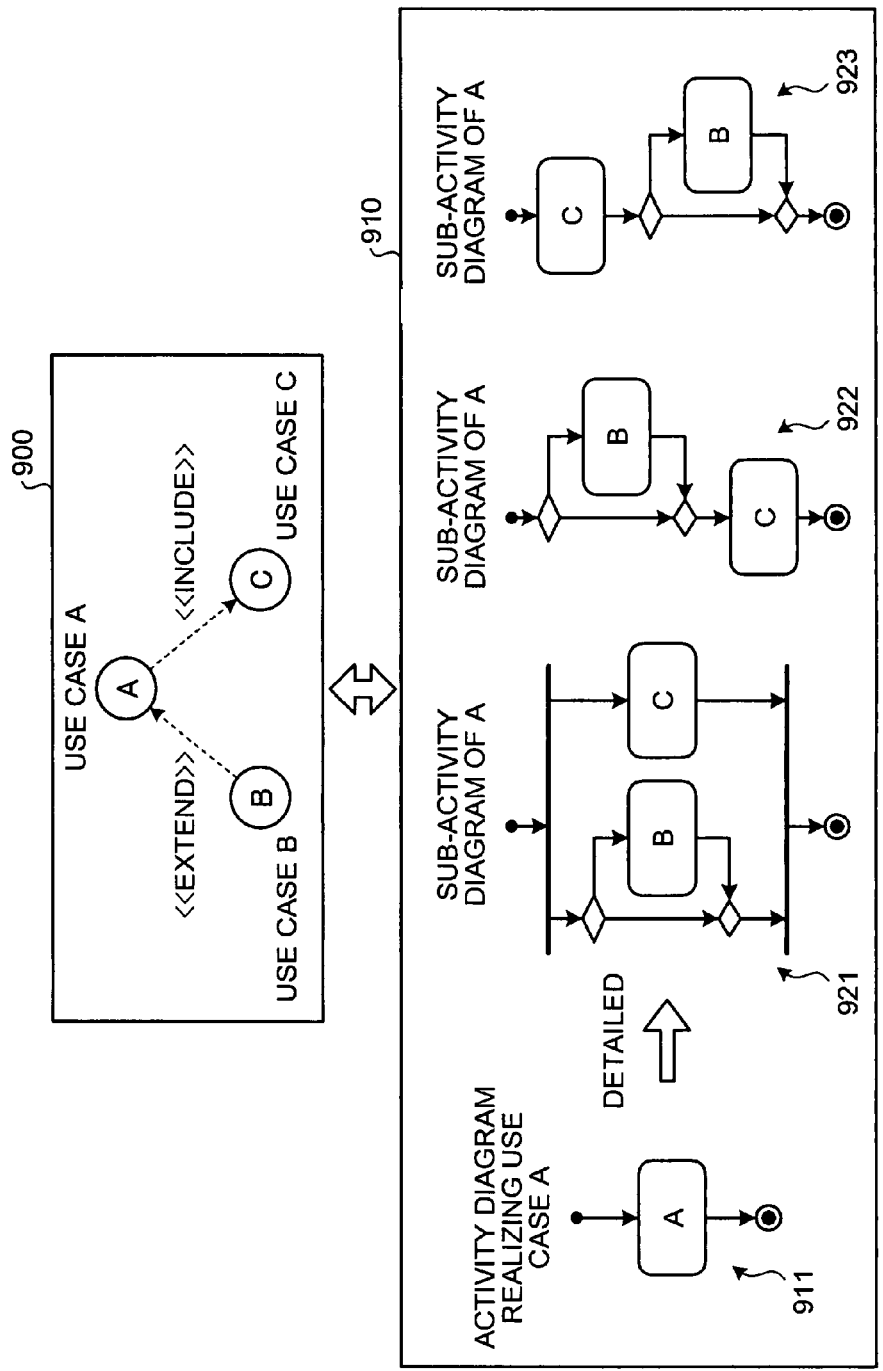
FIG. 9 is an explanatory diagram of a fifth example of conversion between a use case diagram and an activity diagram.

FIG. 9 is an explanatory diagram of a fifth conversion example of the conversion between the use case diagram and the activity diagram. The fifth conversion example is an example in which the use cases A and B have an extend relationship and the use cases A and C have an include relationship. Specifically, in a use case diagram 900, the use case A is a common use case that is an extended use case of the use case B and at the same time, is an including use case of the use case C.

In FIG. 9, if the use case diagram 900 is considered to be the subject use case diagram 211, then the conversion rule <R3> applies to the relationship between the use cases A and B and the conversion rule <R1> applies to the relationship between the use cases A and C. Specifically, the use case diagram 900 is converted to an activity diagram 911 illustrating the process of the use case A as an activity A. The conversion also generates sub-activity diagrams 921 to 923 taking the use cases B and C as sub-activities B and C, respectively, in the activity A and illustrating the process of the sub-activity C alone or illustrating the process of a potential sub-activity B by branching. Since the use case diagram has no order relation, the sub-activity diagrams 921 to 923 covering all order relations are generated.

On the other hand, when the subject activity diagram 212 is converted to the use case diagram 900, the conversion rule <R4> applies to the sub-activity B and the conversion rule <R2> applies to the sub-activity C.

In this case, the activity diagram to be given as the subject activity diagram 212 may be, besides the activity diagram 911 illustrating the process of the upper-class activity A, at least any one of the sub-activity diagrams from among the sub-activity diagrams 921 to 923. Therefore, even if only one of the sub-activity diagrams can be given as the subject activity diagram 212, a corresponding use case diagram can automatically be generated, and by converting the generated use case diagram, sub-activity diagrams covering all order relations can also be obtained.

While the use case diagram usually has no order relation, configuration may be such that when a pre-conversion relationship or post-conversion relationship is given to the use cases B and C, the use case diagram is converted to the sub-activity diagram satisfying the pre-conversion or post-conversion conditions from among the sub-activity diagrams 921 to 923 or such a sub-activity diagram is given as the subject activity diagram 212.

Figure 10:
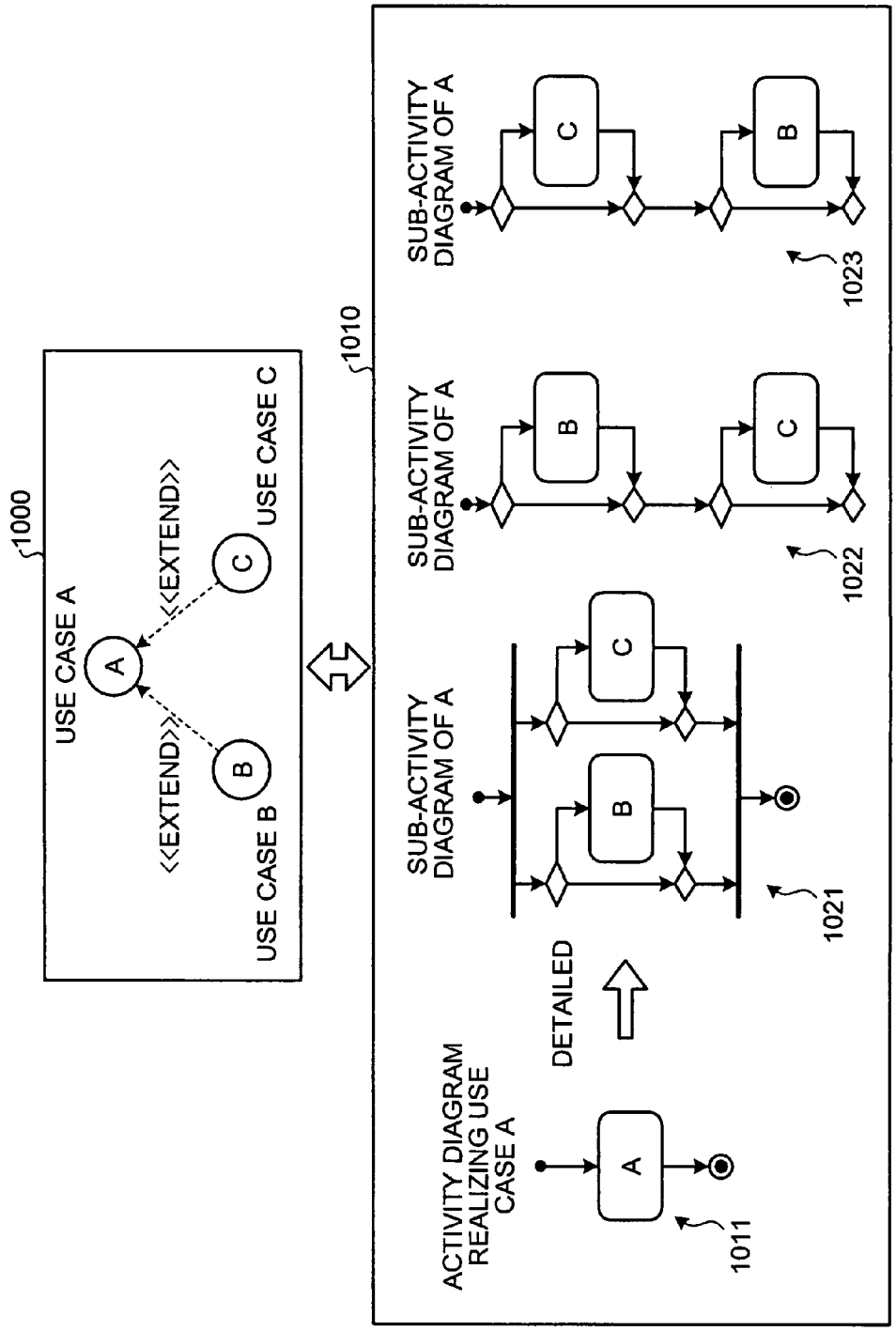
FIG. 10 is an explanatory diagram of a sixth example of conversion between a use case diagram and an activity diagram.

FIG. 10 is an explanatory diagram of a sixth conversion example of the conversion between the use case diagram and the activity diagram. The sixth conversion example is an example in which the use cases A and B have an extend relationship and the use cases A and C also have an extend relationship. Specifically, in a use case diagram 1000, the use case A is a common extended use case of the use cases B and C.

If the use case diagram 1000 illustrated in FIG. 10 is considered to be the subject use case diagram 211, then the conversion rule <R3> applies to the relationship between the use cases A and B and the relationship between the use cases A and C. Specifically, the use case diagram 1000 is converted to an activity diagram 1011 illustrating the process of the use case A as an activity A. The conversion also generates sub-activity diagrams 1021 to 1023 taking the use case B as a sub-activity B and the use case C as a sub-activity C in the activity A and illustrating the process of the potential sub-activities C and B by branching respectively. Since the use case diagram has no order relation, the sub-activity diagrams 1021 to 1023 covering all order relations are generated.

On the other hand, when the subject activity diagram 212 is converted to the use case diagram 1000, the conversion rule <R4> applies to the sub-activities B and C. In this case, the activity diagram to be given as the subject activity diagram 212 may be, besides the activity diagram 1011 illustrating the process of the upper-class activity A, at least any one of the sub-activity diagrams from among the sub-activity diagrams 1021 to 1023.

Therefore, even if only one of the sub-activity diagrams can be given as the subject activity diagram 212, a corresponding use case diagram can automatically be generated, and by converting the generated use case diagram, sub-activity diagrams covering all order relations can also be obtained.

While the use case diagram usually has no order relation, configuration may be such that when a pre-conversion relationship or post-conversion relationship is given to the use cases B and C, the use case diagram is converted to the sub-activity diagram satisfying the pre-conversion or post-conversion condition from among the sub-activity diagrams 1021 to 1023 or such a sub-activity diagram is given as the subject activity diagram 212.

Figure 11:
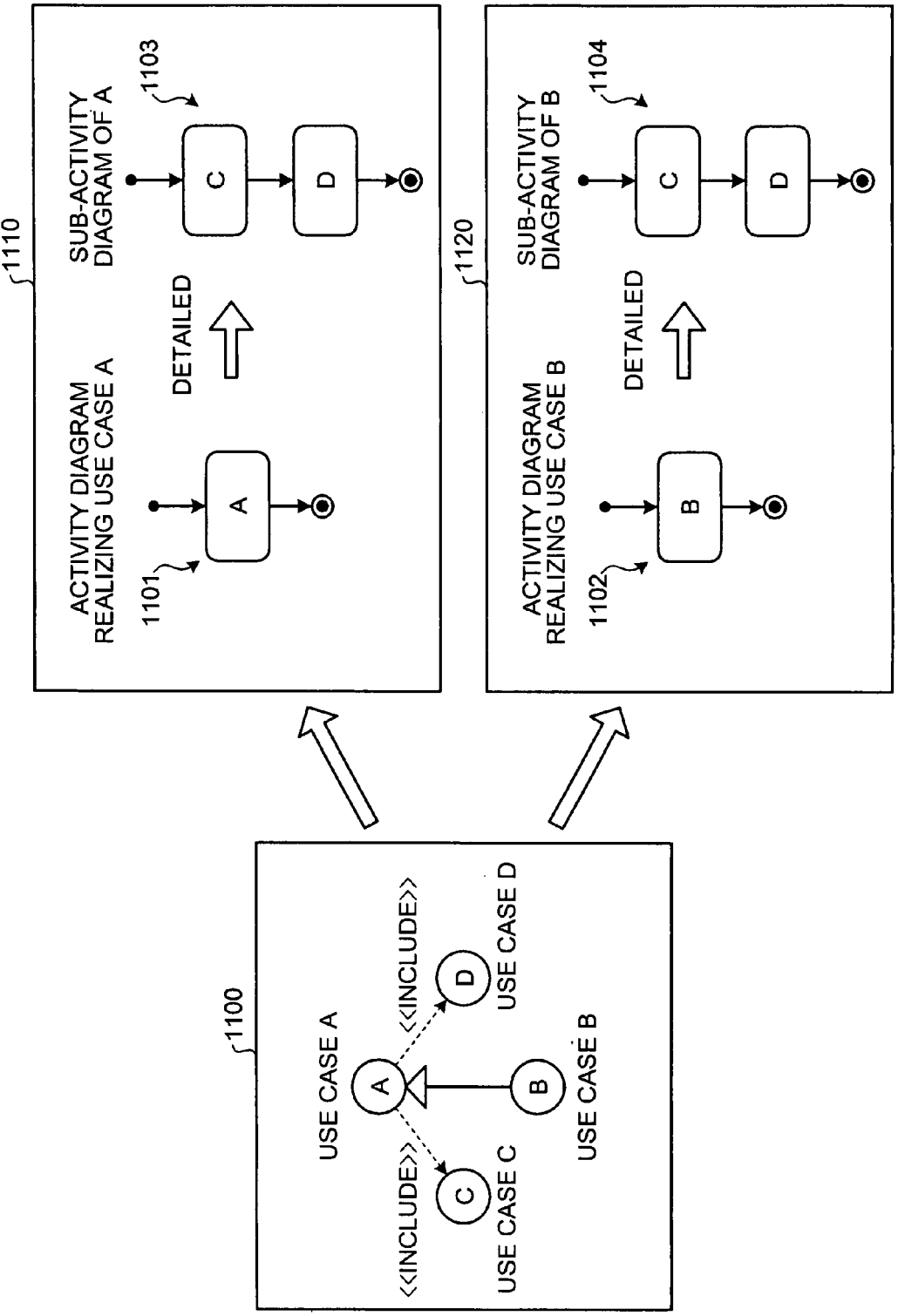
FIG. 11 is an explanatory diagram of a conversion rule regarding generalization relationship.

The use case diagram has a generalization relationship besides the include relationship and the extend relationship. Description will be made of a conversion rule regarding the generalization relationship. FIG. 11 is an explanatory diagram of the conversion rule regarding the generalization relationship. The generalization relationship indicates that an abstract or concrete relationship exists between the use cases. "The use case A is generalized to the use case B" means that the concrete function of the use case A is the use case B. For example, if the use case A is "search for a commodity", then the use case B will be "search for a book (one kind of a commodity)". The conversion rule <R5> of the generalization relationship is as follows.

<R5>

The use cases A and B having a generalization relationship are converted to the activity diagrams 1101 and 1102 illustrating the process of upper-class activities A and B, respectively. In this case, if a sub-activity of the activity A exists, the sub-activity diagram to the activity diagram 1102 becomes an activity diagram of the same processing content as that of the sub-activity diagram of the activity A diagram. Since the generalization relationship can not be identified from the activity diagram sets 1110 and 1120, the conversion can not be made from the activity diagram sets 1110 and 1120 to the use case diagram 1100.

For example, in the use case diagram 1100, if the use case A has included use cases C and D, then the processing content of a sub-activity diagram 1103 of the activity diagram 1101 illustrating the process of the activity A is succeeded by and is identical to the processing content of a sub-activity diagram 1104 of the activity diagram 1102 illustrating the process of the activity B.

Figure 12:
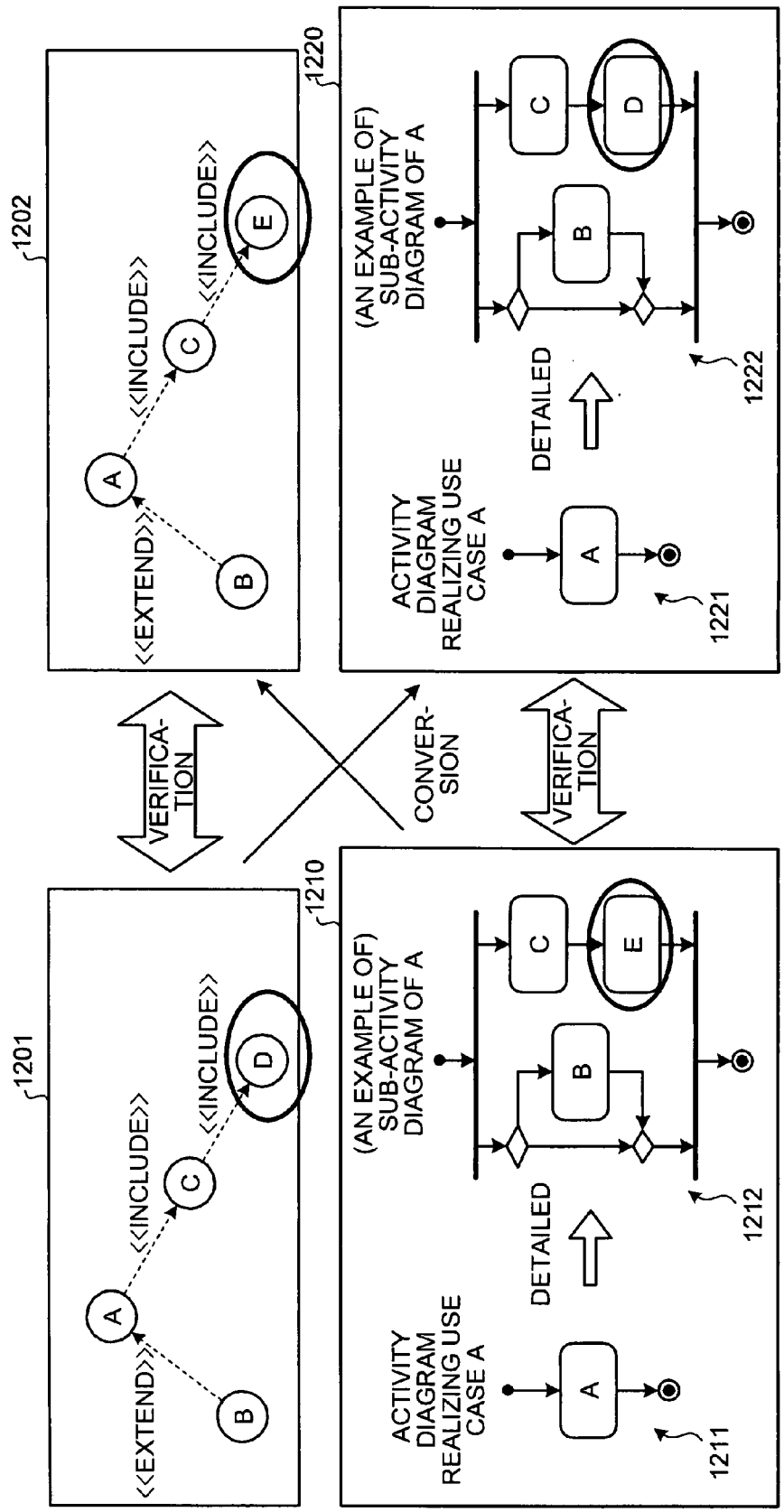
FIG. 12 is an explanatory diagram of content of verification processing.

Description will next be made of specific examples of uniformity verification by the verifying unit 204. FIG. 12 is an explanatory diagram of the content of uniformity verification processing. A use case diagram 1201 illustrated in FIG. 12 is assumed to be correct. If an activity diagram set 1210 is taken as the subject activity diagram 212, then, by converting the activity diagram set 1210, a converted use case diagram 1202 is obtained.

Then, uniformity verification is made between the use case diagram 1201 and the converted use case diagram 1202. Since the relationship between use cases (include or extend) is same between the use case diagram 1201 and the converted use case diagram 1202, use cases themselves are compared between the use case diagram 1201 and the converted use case diagram 1202, and such comparison shows that the included use case of the use case C is different between the use case diagram 1201 and the converted use case diagram 1202.

FIG. 13A is a table of results of uniformity verification of the use case diagrams shown in FIG. 12. According to the table illustrated in FIG. 13A, the use case diagram 1201, the use cases A to D exist (indicated by a circle) and the use case E does not exist (indicated by an x). On the other hand, in the converted used case diagram 1202, the use cases A to C and E exist (indicated by a circle) and the use case D does not exist (indicated by an x). Therefore, the fact that the use case D that should exist in the converted use case diagram 1202 actually does not exist indicates that the activity diagram set 1210 from which the converted use case diagram 1202 is obtained has an error.

The activity diagram set 1210 illustrated in FIG. 12 is assumed to be correct. If the use case diagram 1201 is taken as the subject use case diagram 211, then, by converting this use case diagram 1201, a converted activity diagram set 1220 is obtained. Then, uniformity verification is made between the activity diagram set 1210 and the converted activity diagram set 1220. Since the activity diagrams 1211 and 1221 match, the sub-activity diagrams 1212 and 1222 are compared, and such comparison shows that a part of the sub-activities is different between the sub-activity diagrams 1212 and 1222.

FIG. 13B is a table of results of uniformity verification of the activity diagrams shown in FIG. 12. According to the table illustrated in FIG. 13B, in the activity diagram set 1210 the activity D exists (indicated by a circle) but the activity E does not exist (indicated by an x). On the other hand, in the activity diagram set 1220, the activity E exists (indicated by a circle) but the activity D does not exist (indicated by an x).

Therefore, after the processing of the activity C, the activity E is processed in the sub-activity diagram 1212 and the activity D rather than the activity E is processed in the sub-activity diagram 1222. In this case, since it is assumed that the activity diagram set 1210 is correct, it is known that the use case diagram 1201 from which the activity diagram set 1220 is obtained has an error.

FIG. 14 is an explanatory diagram of contents of other verifying processing. A use case diagram 1400 illustrated in FIG. 14 is assumed to be correct. If the activity diagram set 1410 is taken as the subject activity diagram 212, then, by converting this activity diagram set 1410, converted use case diagrams 1401 and 1402 are obtained.

Specifically, by converting the activity diagram 1411 and the sub-activity diagram 1412 (or 1414), the use case diagram 1401 is obtained, and by converting the activity diagram 1411 and the sub-activity diagram 1413, the use case diagram 1402 is obtained.

Then, uniformity verification is made between the use case diagram 1400 and the converted use case diagrams 1401 and 1402. Since the use cases A, B, and C themselves are same among the use case diagrams 1400, 1401, and 1402, the relationship between the use cases is verified.

FIG. 15A is a table of uniformity verification results for the use case diagrams shown in FIG. 14. Between the use case diagram 1400 and the converted use case diagram 1401, both the relationship between the use cases A and B and the relationship between the use cases A and C are same (indicated by a circle). On the other hand, in the converted use case diagram 1402, the relationship between the use cases A and C is same as in the use case diagram 1400 (indicated by a circle) but the relationship between the use cases A and B is an include relationship and therefore, is different from the relationship between the use cases A and B in the use case diagram 1400 (indicated by an x).

The activity diagram set 1410 illustrated in FIG. 14 is assumed to be correct. If the use case diagram 1400 is taken as the subject use case diagram 211, then, by converting this use case diagram 1400, a converted activity diagram set 1420 is obtained. Then, uniformity verification is made between the activity diagram sets 1410 and 1420. Specifically, the uniformity verification is made between the upper-class activity diagrams 1411 and 1421.

FIG. 15B is a table of results of verification of the upper-class activity diagrams shown in FIG. 14. The processing procedure illustrated in FIG. 15B is same between the activity diagrams 1411 and 1421 (indicated by a circle).

Next, the uniformity verification is made between the sub-activity diagrams 1412 to 1414 and the sub-activity diagrams 1422 to 1424. Specifically, the uniformity verification is made between the sub-activity diagrams 1412 and 1422 performing parallel processing, between the sub-activity diagrams 1413 and 1423 processing in the order of the activity B to the activity C, and between the sub-activity diagrams 1414 and 1424 processing in the order of the activity C to the activity B.

FIG. 15C is a table of uniformity verification results of the sub-activity diagrams shown in FIG. 14. The processing procedure of activities B and C illustrated in FIG. 15C is same between the sub-activity diagrams 1412 and 1422 (indicated by a circle). The processing procedure of activities B and C is same between the sub-activity diagrams 1414 and 1424 (indicated by a circle).

On the other hand, with respect to the processing procedure of the activities B and C in the sub-activity diagrams 1413 and 1423, while the activity B is always processed before the processing of the activity C in the sub-activity diagram 1413 illustrated in FIG. 14, the activity B may or may not be processed depending on the branching before the processing of the activity C in the sub-activity diagram 1423. Therefore, the processing of the activity B is different between the sub-activity diagrams 1413 and 1423 (indicated by an x).

Figure 16:
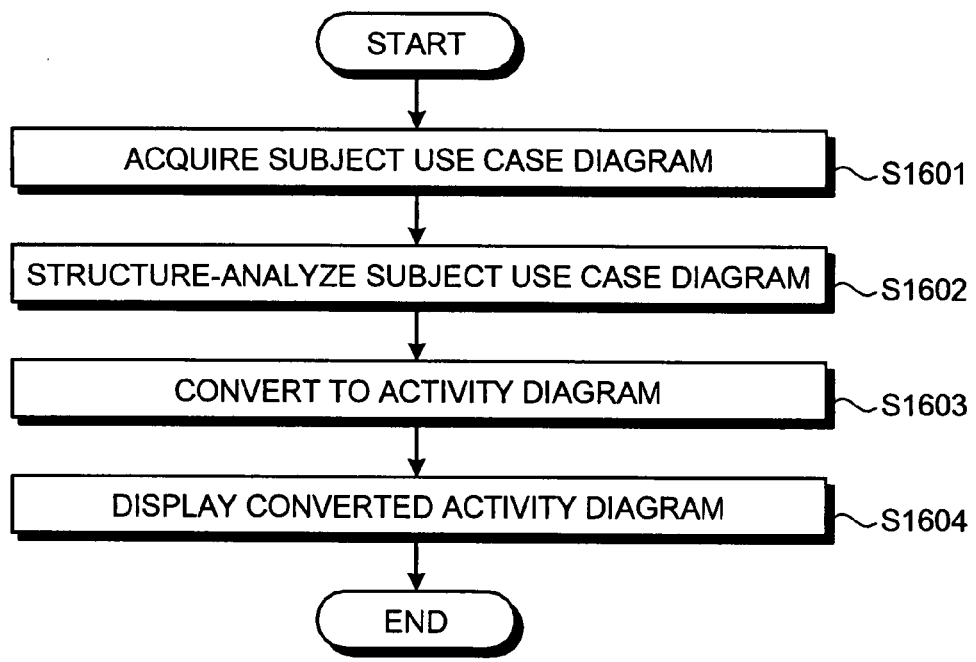
FIG. 16 is a flowchart of a design and verification support processing procedure for converting the use case diagram to the activity diagram.

Description will next be made of a design and verification support processing procedure of the design and verification support apparatus 200 according to the embodiments of the present invention. FIG. 16 is a flowchart of the design and verification support processing procedure for the case of converting the use case diagram to the activity diagram.

In FIG. 16, firstly, the subject use case diagram 211 is acquired by the acquiring unit 201 (step S1601). Next, the subject use case diagram 211 is structure-analyzed by the use case diagram structure analyzing unit 221 (step S1602). Then, the structure-analyzed subject use case diagram 211 is converted to an activity diagram by the use case diagram-activity diagram converting unit 231 (step S1603) and the converted activity diagram 251 is displayed (step S1604), thereby enabling visual confirmation of uniformity of the acquired activity diagram and the converted activity diagram 251.

Figure 17:
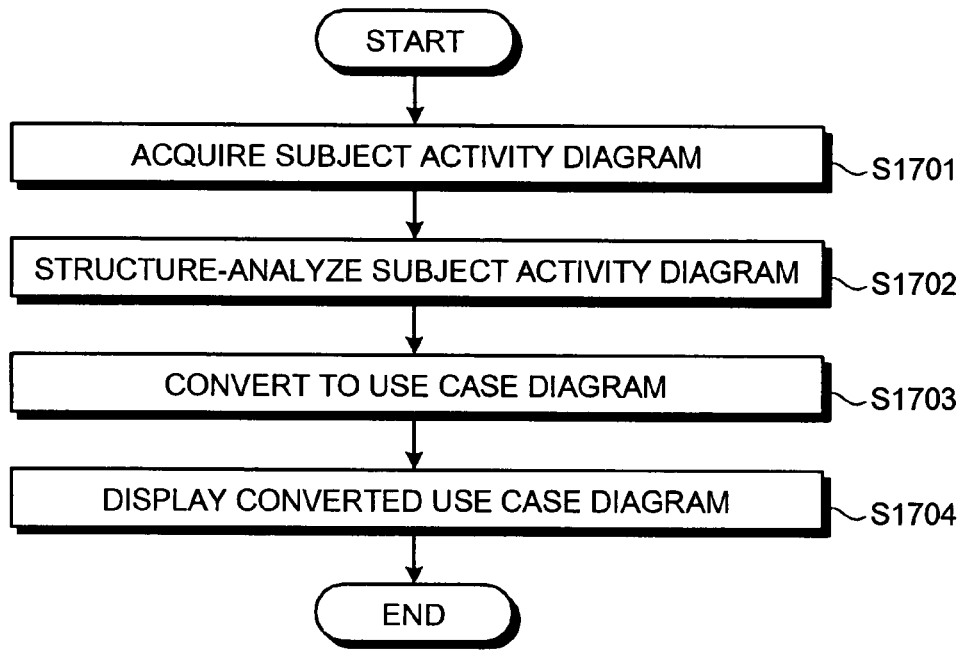
FIG. 17 is a flowchart of the design and verification support processing procedure for converting the activity diagram to the use case diagram.

FIG. 17 is a flowchart of the design and verification support processing procedure for the case of converting the activity diagram to the use case diagram. Firstly, the subject activity diagram 212 is acquired by the acquiring unit 201 (step S1701). Next, the subject activity diagram 212 is structure-analyzed by the activity diagram structure analyzing unit 222 (step S1702). Then, the structure-analyzed subject activity diagram 212 is converted to a use case diagram by the activity diagram-use case diagram converting unit 232 (step S1703) and the converted use case diagram 252 is displayed (step S1704), thereby enabling visual confirmation of uniformity of the acquired use case diagram and the converted use case diagram 252.

Figure 18:
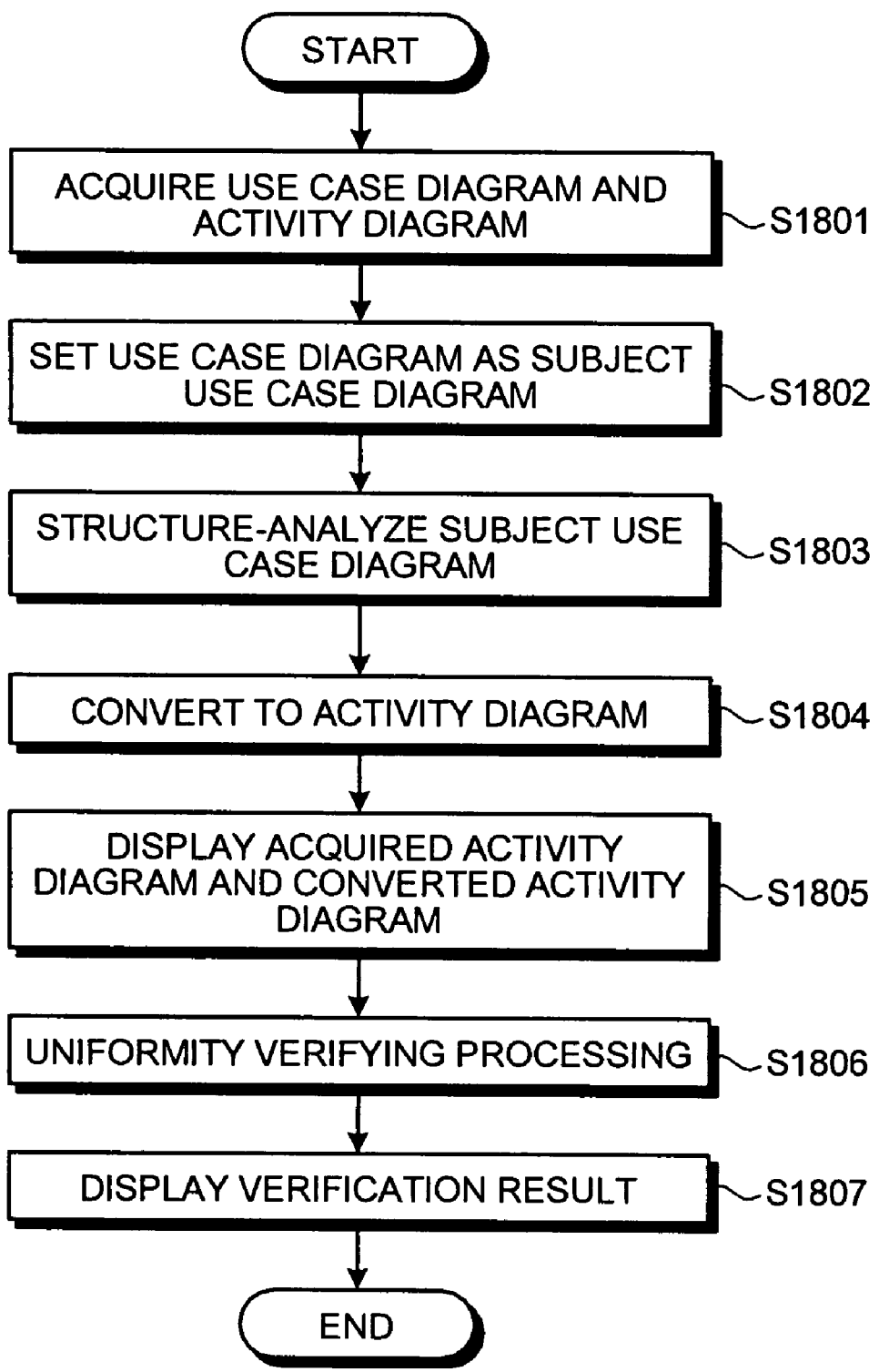
FIG. 18 is a flowchart of the design and verification support processing procedure for verifying the activity diagram.

FIG. 18 is a flowchart of the design and verification support processing procedure for the case of verifying the activity diagram. Firstly, the use case diagram and the activity diagram (in the description of FIG. 18, "acquired activity diagram") are acquired by the acquiring unit 201 (step S1801).

Next, the use case diagram is set as the subject use case diagram 211 (step S1802) and the subject use case diagram 211 is structure-analyzed by the use case diagram structure analyzing unit 221 (step S1803). Then, the structure-analyzed subject use case diagram 211 is converted to an activity diagram by the use case diagram-activity diagram converting unit 231 (step S1804). Next, the acquired activity diagram and the converted activity diagram 251 are displayed (step S1805), thereby enabling visual confirmation of uniformity of the acquired activity diagram and the converted activity diagram 251.

Next, uniformity verification is made between the acquired activity diagram and the converted activity diagram 251 by the activity diagram verifying unit 241 (step S1806), thereby enabling automatic extraction of differences between the acquired activity diagram and the converted activity diagram 251. The results of the uniformity verification are displayed (step S1807), thereby enabling automatic clarification of the differences between the acquired activity diagram and the converted activity diagram 251.

Figure 19:
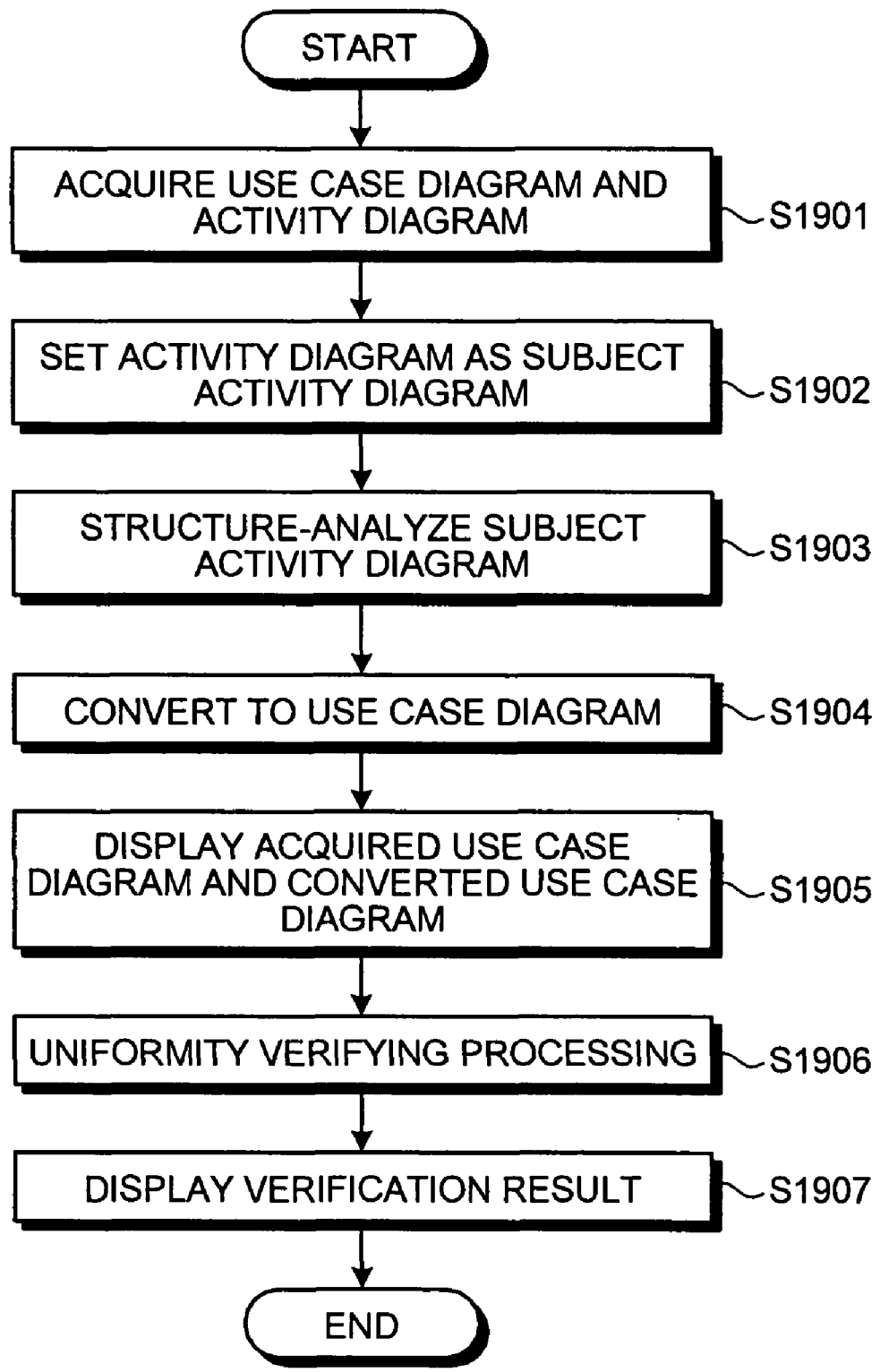
FIG. 19 is a flowchart of the design and verification support processing procedure for verifying the use case diagram.

FIG. 19 is a flowchart of the design and verification support processing procedure for the case of verifying the use case diagram. Firstly, the use case diagram (in the description of FIG. 19, "acquired use case diagram") and the activity diagram are acquired by the acquiring unit 201 (step S1901).

Next, the activity diagram is set as the subject activity diagram 212 (step S1902) and the subject activity diagram 212 is structure-analyzed by the activity diagram structure analyzing unit 222 (step S1903) and is then converted to a use case diagram by the activity diagram-use case diagram converting unit 232 (step S1904). The acquired use case diagram and the converted use case diagram 252 are displayed (step S1905), thereby enabling visual confirmation of uniformity of the acquired use case diagram and the converted use case diagram 252.

Next, the uniformity verification is made between the acquired use case diagram and the converted use case diagram 252 by the use case diagram verifying unit 242 (step S1906), thereby enabling automatic extraction of differences between the acquired use case diagram and the converted use case diagram 252. Next, the results of the verification are displayed (step S1907), thereby enabling automatic clarification of the differences between the acquired use case diagram and the converted use case diagram 252.

As seen above, the embodiments of the present invention enable, only by giving the use case diagram, automatic generation of an activity diagram of the same content as that of the given use case diagram, and only by giving the activity diagram, automatic generation of a use case diagram of the same content as that of the given activity diagram.

Therefore, a designer or verifier is only required to acquire either the use case diagram or the activity diagram an object to be designed and an improvement in design and verification work efficiency can be achieved.

In particular, since the activity diagram has a concept of the order relation of activities, the activity diagrams has, in many cases, multiple sub-activity diagrams. However, the embodiments of the present invention can cover all corresponding activity diagrams even if only one use case diagram is given, and can achieve improvement of work efficiency.

When the use case diagram and the activity diagram are manually prepared, inconsistency occurs between these two diagrams in some cases. However, the embodiments of the present invention, by verifying the converted use case diagram-activity diagram, enable generation of consistent, high-quality use case diagram-activity diagrams without such inconsistency.

As described above, the recording medium with the design and verification support program recorded thereon, the design and verification support apparatus, and the design and verification support method, reduced manpower and shortened design period can be achieved by easy generation of a consistent, high-quality use case diagram and activity diagram.

The design and verification support method described in the embodiments of the present invention can be realized by executing a pre-arranged program via a computer such as a personal computer or a workstation in which the program is recorded on a computer-readable recording medium such as a hard disk, a flexible disk, a CD-ROM, an MO, and a DVD and is executed by being read out from the recording medium by the computer. This program may be in the form of a transmission medium that can be distributed by way of a network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable medium storing a design and verification support program causing a computer to execute an operation, the operation comprising:

acquiring a use case diagram representing a function of an object subject to design which requires verification, the use case diagram including at least one of an inclusion relationship, an extend relationship, and a generalization relationship between use cases;

analyzing a structure of the use case diagram;

converting the use case diagram to an activity diagram representing a processing procedure of the object, based on the structure analyzed at the analyzing; and outputting the activity diagram converted at the converting.

2. The method according to claim 1, wherein, when the use cases include a relationship, an including use case of the use cases is converted to an activity diagram which processes an activity corresponding to the including use case and, an included use case of the use cases is converted to a sub-activity diagram which processes a sub-activity of the activity corresponding to the included use case.

3. The method according to claim 1, wherein, when the use cases have the extend relationship, a base use case of the use cases is converted to an activity diagram which processes an activity corresponding to the base use case and, an extending use case of the use cases is converted to a sub-activity diagram which processes a potential sub-activity of the activity corresponding to the extending use case in a branch operation.

4. The method according to claim 1, wherein said analyzing includes analyzing of the structure the use case diagram including a type of relationship between said use cases.

5. A design and verification support apparatus comprising:
an acquiring unit that acquires a use case diagram representing a function of an object subject to design which requires verification, the use case diagram including at least one of an inclusion relationship, an extend relationship, and a generalization relationship between use cases;
an analyzing unit that analyzes a structure of the use case diagram;
a converting unit that converts the use case diagram to an activity diagram representing a processing procedure of the object, based on the structure analyzed by the analyzing unit; and
an outputting unit that outputs the activity diagram converted by the converting unit.

6. A design and verification support method comprising:
acquiring a use case diagram representing a function of an object subject to design which requires verification, the use case diagram including at least one of an inclusion relationship, an extend relationship, and a generalization relationship between use cases;
analyzing, by a computer, a structure of the use case diagram;
converting, by a computer, the use case diagram to an activity diagram representing a processing procedure of the object, based on the structure analyzed at the analyzing; and
outputting the activity diagram converted at the converting.

* * * * *